(12) United States Patent
Hsu et al.

(10) Patent No.: US 7,352,209 B2
(45) Date of Patent: Apr. 1, 2008

(54) VOLTAGE-LEVEL CONVERTER

(75) Inventors: Steven K. Hsu, Lake Oswego, OR (US); Mark A. Anders, Hillsboro, OR (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/411,647

(22) Filed: Apr. 26, 2006

(65) Prior Publication Data

US 2006/0186924 A1    Aug. 24, 2006

Related U.S. Application Data

(62) Division of application No. 09/896,523, filed on Jun. 29, 2001, now abandoned.

(51) Int. Cl.
*H03K 19/0175* (2006.01)
(52) U.S. Cl. .............................. 326/81; 326/68; 326/80
(58) Field of Classification Search ................ 326/68, 326/80–81; 327/333
See application file for complete search history.

(56) References Cited

U.S. PATENT DOCUMENTS

| | | | |
|---|---|---|---|
| 5,191,233 A | 3/1993 | Nakano | |
| 5,399,915 A | 3/1995 | Yahata | |
| 5,406,142 A * | 4/1995 | Nakama et al. | ............... 326/68 |
| 5,473,268 A | 12/1995 | Declercq et al. | |
| 5,559,996 A | 9/1996 | Fujioka | |
| 5,896,043 A | 4/1999 | Kumagai | |
| 5,917,359 A | 6/1999 | Fukunaga | |
| 5,920,203 A | 7/1999 | Bailey et al. | |
| 6,002,290 A | 12/1999 | Ronald et al. | |
| 6,191,779 B1 * | 2/2001 | Taguchi et al. | ............. 345/204 |
| 6,201,429 B1 | 3/2001 | Rosenthal | |
| 6,249,145 B1 | 6/2001 | Tanaka et al. | |
| 6,268,755 B1 | 7/2001 | Summerlin et al. | |
| 6,275,070 B1 | 8/2001 | Pantelakis et al. | |
| 6,370,071 B1 * | 4/2002 | Lall et al. | ................... 365/205 |
| 2002/0180508 A1 * | 12/2002 | Kanno et al. | ............... 327/333 |

OTHER PUBLICATIONS

Kanno, Y., et al., "Level Converters with High Immunity to Power-Supply Bouncing for High-Speed Sub-1-V LSIs", *2000 Symposium on VLSI Circuits Digest of Technical Papers*, pp. 202-203, 2000, no month.

"U.S. Appl. No. 09-896523 (Atty Ref 884.453US1) Final office action mailed Sep. 10, 2002", 6 pgs.

(Continued)

*Primary Examiner*—Anh Q. Tran
(74) *Attorney, Agent, or Firm*—Schwegman, Lundberg & Woessner, P.A.

(57) ABSTRACT

A voltage level converter includes a static voltage level converter and a split-level output circuit coupled to the static voltage-level converter. In another embodiment, the voltage-level converter includes a static voltage level-converter, a first transistor, and a second transistor. The static voltage-level converter includes an input node, a first pull-up node, a second pull-up node, an inverter output node, and an output node. The first transistor is coupled to the input node and the first pull-up node. The second transistor is coupled to the second pull-up node and the inverter output node.

19 Claims, 11 Drawing Sheets

OTHER PUBLICATIONS

"U.S. Appl. No. 09-896523 (Atty Ref 884.453US1) Non-final office action mailed Jan. 29, 2003", 7 pgs.

"U.S. Appl. No. 09/896523 (Atty Ref 884.453US1) Final office action mailed Jun. 6, 2005", 6 pgs.

"U.S. Appl. No. 09/896523 (Atty Ref 884.453US1) Final office action mailed Jun. 11, 2003", 6 pgs.

"U.S. Appl. No. 09/896523 (Atty Ref 884.453US1) Non-final office action mailed Jan. 14, 2004", 6 pgs.

"U.S. Appl. No. 09/896523 (Atty Ref 884.453US1) Non-final office action mailed May 8, 2002", 7 pgs.

"U.S. Appl. No. 09/896523 (Atty Ref 884.453US1) Non-final office action mailed Oct. 26, 2005", 8 pgs.

"U.S. Appl. No. 09/896523 (Atty Ref 884.453US1) Response filed Apr. 14, 2004 to Non-Final Office Action mailed Jan. 14, 2004", 5 pgs.

"U.S. Appl. No. 09/896523 (Atty Ref 884.453US1) Response filed Aug. 11, 2003 to Final Office Action mailed Jun. 11, 2003", (Aug. 11, 2003), 5 pages.

"U.S. Appl. No. 09/896523 (Atty Ref 884.453US1) Response filed Sep. 6, 2005 to Final Office Action mailed Jun. 6, 2005", (Sep. 6, 2005), 14 pages.

"U.S. Appl. No. 09/896523 (Atty Ref 884.453US1) Response filed Nov. 12, 2002 to Final Office Action mailed Sep. 10, 2002", (Nov. 12, 2002), 5 pages.

"U.S. Appl. No. 09/896523 (Atty Ref 884.453US1) Response filed Apr. 21, 2003 to Non-Final Office Action mailed Jan. 29, 2003", (Apr. 21, 2003) 6 pages.

"U.S. Appl. No. 09/896523 (Atty Ref 884.453US1) Response filed Jun. 28, 2002 to Non-Final Office Action mailed May 8, 2002", (Jun. 28, 2002), 5 pages.

* cited by examiner

VOLTAGE-LEVEL CONVERTER

This application is a Divisional of U.S. Ser. No. 09/896,523 filed Jun. 29, 2001 now abandoned which is incorporated herein by reference.

FIELD

This invention relates to integrated circuits and, more particularly, to integrated circuit voltage-level converters.

BACKGROUND

In traditional complementary metal-oxide semiconductor (CMOS) very large scale integration (VLSI) circuit designs, CMOS integrated circuits are powered by one voltage level. Although traditional CMOS integrated circuits powered by one voltage level continue to be developed and manufactured, the demand for longer battery life in many electronic devices, such as ultra low-power microprocessors used in portable computers and digital signal processors used in personal digital assistants and cellular telephones, is creating a demand for CMOS VLSI circuit designs that consume less power than traditional designs.

One approach to reducing power in a CMOS circuit design is to power the CMOS circuits with two voltage levels. The first or higher voltage level powers critical circuit paths and critical functional units. A critical circuit path is a circuit path that is designed to transmit signals as fast as possible along the path. A critical functional unit is a functional unit, such as an arithmetic and logic unit, that is designed perform a logical operation as fast as possible. A CMOS circuit path powered at a higher voltage level transmits a signal more rapidly than the same CMOS path powered at a lower voltage level, and a CMOS functional unit powered by higher voltage level generally processes signals more rapidly than the same functional unit powered at a lower voltage level. The second or lower voltage level powers non-critical paths and non-critical functional units. The result of applying this design approach to CMOS circuits is that the non-critical CMOS circuit paths, which are powered at the lower voltage level, and the non-critical CMOS functional units, which are also powered at the lower voltage level, consume less power than they would consume if powered at a higher voltage level. Thus, a complete CMOS circuit can be designed to consume less power when powered at two voltage levels than when powered at one voltage level.

One problem with powering a CMOS circuit with two voltage levels, such as a lower voltage level and a higher voltage level, is that signals generated by circuits powered at the lower voltage level are usually incompatible with circuits powered at the higher voltage level. To make signals generated by circuits powered at the lower voltage level compatible with circuits powered at the higher voltage level, a voltage level converter is inserted between the circuits powered at the lower voltage level and the circuits powered at the higher voltage level.

FIG. 1 is a schematic diagram of a prior art voltage level converter 100. The prior art voltage level converter 100 includes n-type insulated-gate field-effect transistors (FETs) 102-103, an inverter 104, cross-coupled p-type insulated-gate FETs 106-107, and an output buffer 109. The p-type insulated-gate FET 106 is coupled to the n-type insulated-gate FET 102 at node 111, the p-type insulated-gate FET 107 is coupled to the n-type insulated-gate FET 103 at node 113, the gate of the p-type insulated-gate FET 106 is coupled to the node 113, the gate of the p-type insulated-gate FET 107 is coupled to the node 111, and the input node 115 is coupled to the n-type insulated-gate FET 103 through the inverter 104.

FIG. 2A is a sketch of a logic signal illustrating a transition from a high logic level, $V_{CCL}$, to a low logic level, $V_{LOW}$. The logic signal shown in FIG. 2A is one example of INPUT SIGNAL 117 shown in FIG. 1. FIG. 2B is a sketch of the logic signal at the node 113 that results from applying the input logic signal shown in FIG. 2A to the prior art voltage-level converter 100 shown in FIG. 1. FIG. 2C is a sketch of the BUFFERED OUTPUT SIGNAL 127 that results from applying the input logic signal shown in FIG. 2A to the prior art voltage level converter 100.

Referring again to FIG. 1, for INPUT SIGNAL 117 at a high logic level (assuming a high logic level corresponds a positive voltage level) as shown in FIG. 2A at 201, the n-type insulated-gate FET 102 is turned on, the p-type insulated-gate FET 106 is turned off, the n-type insulated-gate FET 103 is turned off, and the p-type insulated-gate FET 107 is turned on. Thus, substantially zero current flows between the power supply node 119 and the ground node 121, substantially zero current flows between the power supply node 123 and the ground node 125, and substantially zero power is consumed by the voltage level converter 100.

FIG. 2D is a sketch of a logic signal illustrating a transition from a low logic level, $V_{LOW}$, to a high logic level, $V_{CCL}$. For the INPUT SIGNAL 117 at a low logic level (assuming a low logic level corresponds to a zero voltage level) as shown at 203 in FIG. 2D, the n-type insulated-gate FET 102 is turned off, the p-type insulated-gate FET 106 is turned on, the n-type insulated-gate FET 103 is turned on, and the p-type insulated-gate FET 107 is turned off. Thus, substantially zero current flows between the power supply node 119 and the ground node 121, substantially zero current flows between the power supply node 123 and the ground node 125, and substantially zero power is consumed by the voltage level converter 100. Therefore, for a static input logic signal at input node 115 substantially zero power is consumed by the prior art voltage-level converter 100.

However, during the transition of a signal at the input node 115 power is consumed by the prior art voltage-level converter 100. For example, during the transition of the INPUT SIGNAL 117 from a high logic-level to a low logic-level, as shown at 205 in FIG. 2A, the p-type insulated-gate FET 103 turns on before the n-type insulated-gate FET 107 turns off, so current flows between the power supply node 123 and the ground node 125. Similarly, during the transition of INPUT SIGNAL 117 from a low logic-level to a high logic-level, as shown at 207 in FIG. 2D, the n-type insulated-gate FET 102 turns on before the p-type insulated-gate FET 106 turns off, so current flows between the power supply node 119 and the ground node 121. Therefore, power is consumed by voltage converter circuit 100 during transitions of the INPUT SIGNAL 117.

Unfortunately, including a voltage-level inverter, such as voltage-level converter 100, in a two voltage-level CMOS VLSI circuit design increases the power consumed by the circuit when compared to the power consumed in a traditional CMOS one supply voltage circuit design.

For these and other reasons there is a need for the present invention.

DETAILED DESCRIPTION

Figure 1:
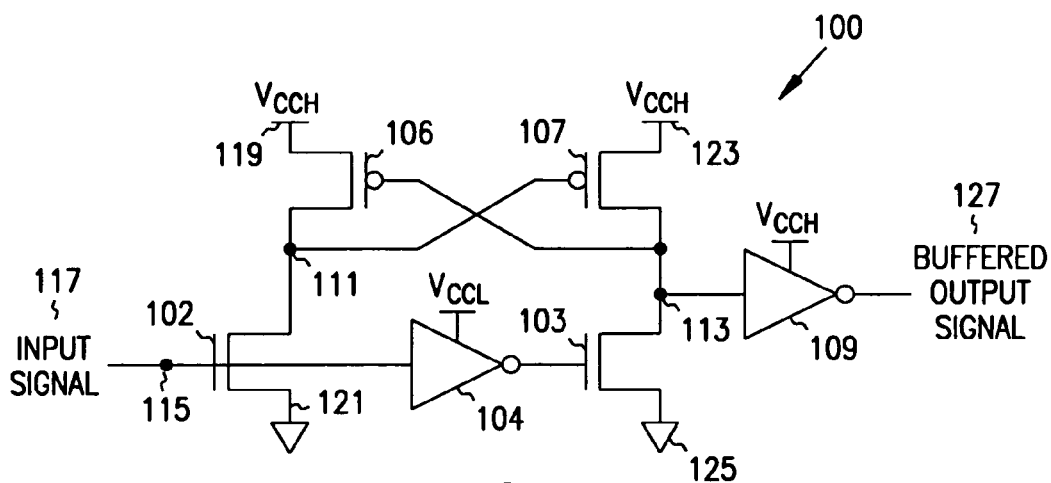
FIG. 1 is a schematic diagram of a prior art voltage-level converter.

In the following detailed description of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

To simplify the description of the operation of the embodiments of the voltage-level converters described herein the input and output signals for each of the voltage-level converters are described only once below.

Figure 2A:
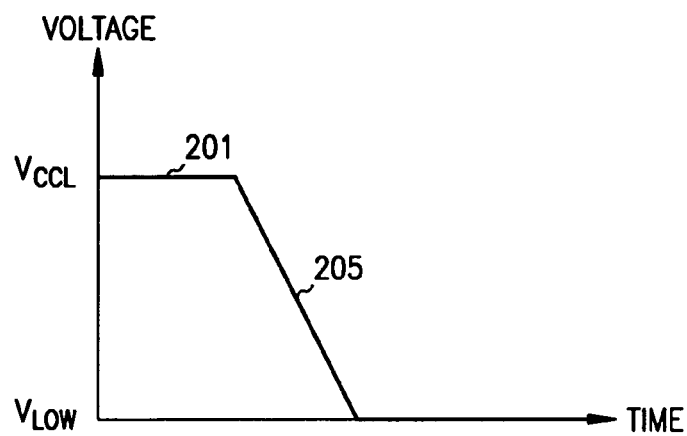
FIG. 2A is a sketch of a logic signal illustrating a transition from a high logic level, $V_{CCL}$, to a low logic level, $V_{LOW}$.
Figure 2B:
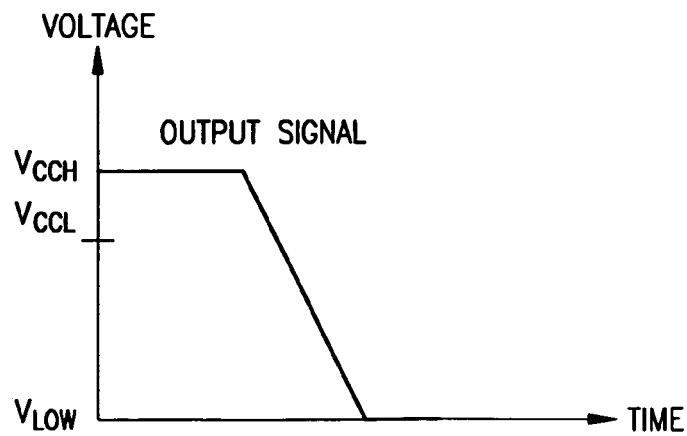
FIG. 2B is a sketch of a logic signal illustrating a transition from a high logic level, $V_{CCH}$, to a low logic level, $V_{LOW}$.
Figure 2C:
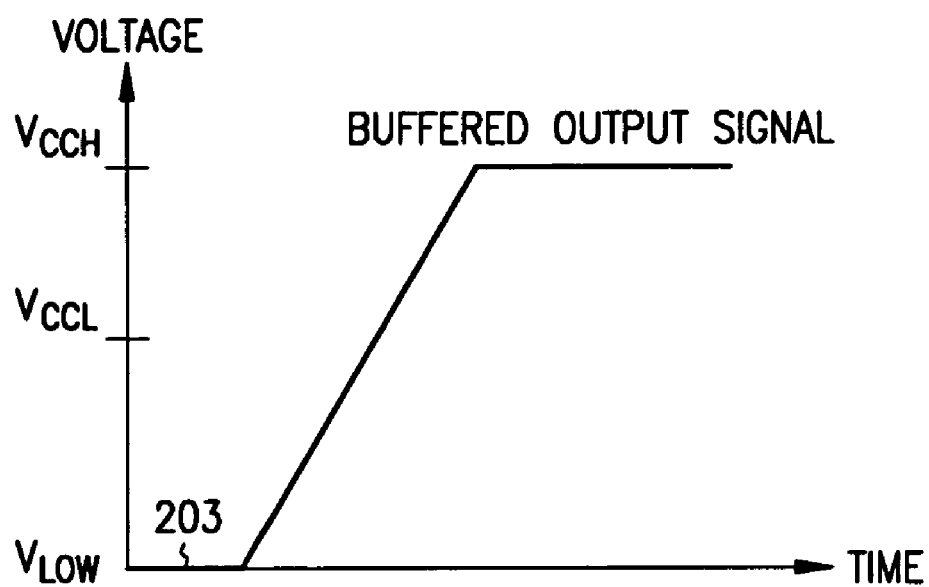
FIG. 2C is a sketch of a logic signal illustrating a transition from a low logic level, $V_{LOW}$, to a high logic level, $V_{CCH}$.
Figure 2D:
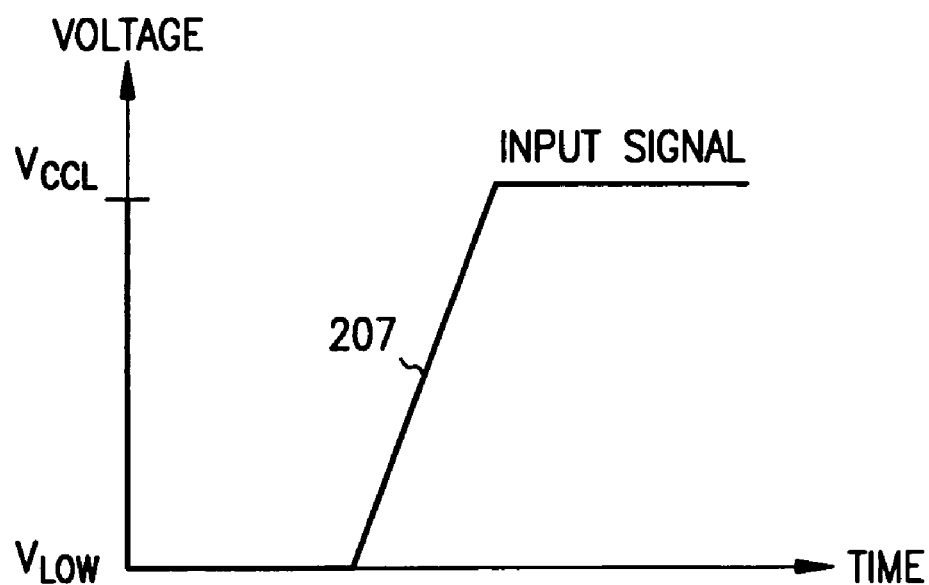
FIG. 2D is a sketch of a logic signal illustrating a transition from a low logic level, $V_{LOW}$, to a high logic level, $V_{CCL}$.

Each of the example embodiments of the voltage-level converters disclosed in the block diagrams and schematics shown in FIGS. 3A-3B, 4A-4D, 5A-5D, and 6A-6C receive and convert an INPUT SIGNAL comprised of a first pair of signal levels to an OUTPUT SIGNAL or a BUFFERED OUTPUT SIGNAL comprised of a second pair of signal levels. The signals illustrated in FIGS. 2A and 2D represent typical INPUT SIGNALS comprising the first pair of signal levels, $V_{CCL}$ and $V_{LOW}$. The signals illustrated in FIGS. 2B and 2C represent typical OUTPUT SIGNALS and BUFFERED OUTPUT SIGNALS comprising the second pair of signal levels, $V_{CCH}$ and $V_{LOW}$.

The $V_{CCH}$ signal level is greater than the $V_{CCL}$ signal level.

Figure 3A:
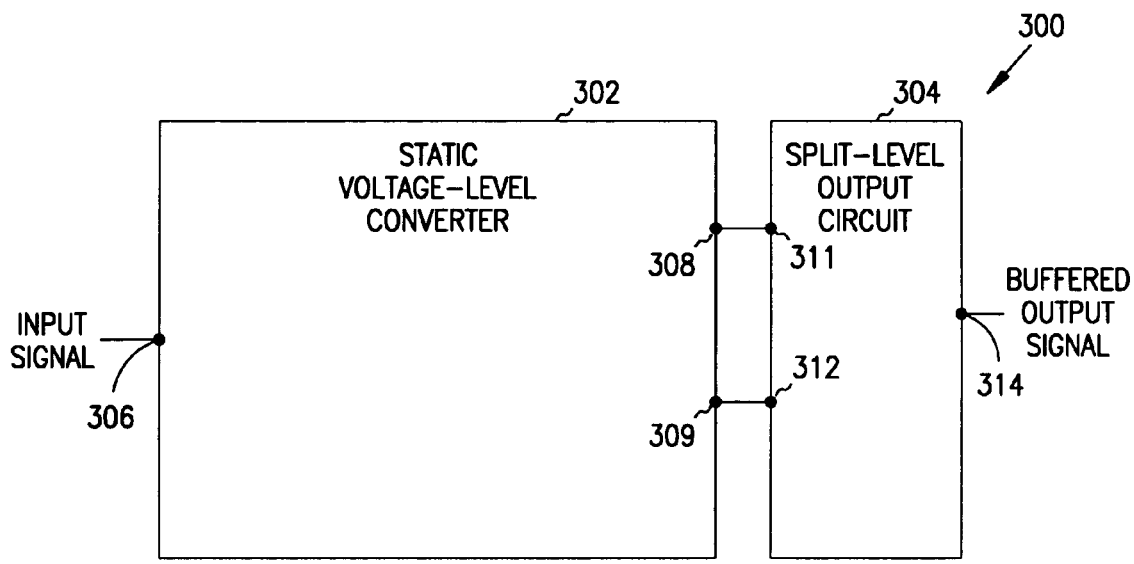
FIG. 3A is a block diagram of one embodiment of a voltage-level converter including a static voltage-level converter coupled to a split-level output circuit according to the teachings of the present invention.

FIG. 3A is a block diagram of one embodiment of a voltage-level converter 300 including a static voltage-level converter 302 coupled to a split-level output circuit 304 according to the teachings of the present invention.

The static voltage-level converter 302 includes an input node 306, a first output node 308, and a second output node 309. The split-level output circuit 304 includes a first split-level input node 311, a second split-level input node 312, and a split-level output node 314. The first split-level input node 311 is coupled to the first output node 308 of the static voltage-level converter 302, and the second split-level input node 312 is coupled to the second output node 309 of the static voltage-level converter 302. A split-level output circuit includes at least two input nodes for receiving input signals.

The static voltage-level converter 302 comprises a circuit that consumes substantially zero power for static or unchanging inputs. Thus, for an INPUT SIGNAL having a logical zero voltage level or a logical one voltage level, the static voltage-level converter 302 consumes substantially zero power. The voltage-level converter 300 is not limited to use in connection with a particular static voltage-level converter 302. Any static voltage-level converter that consumes substantially zero power for static or unchanging inputs is suitable for use in connection with the voltage-level converter 300.

The split-level output circuit 304 provides improved current drive capability when compared with the current drive capability provided at output nodes 308 and 309 of the static voltage-level converter 302 or with a single-ended inverter. The improved current drive capability permits the voltage-level converter 300 to drive more logic gates or larger capacitive loads without substantially increasing the rise time (the time for a signal to change from 10% to 90% of its final value) or the fall time (the time for a signal to change from 90% to 10% of its initial value) of the BUFFERED OUTPUT SIGNAL.

Figure 3B:
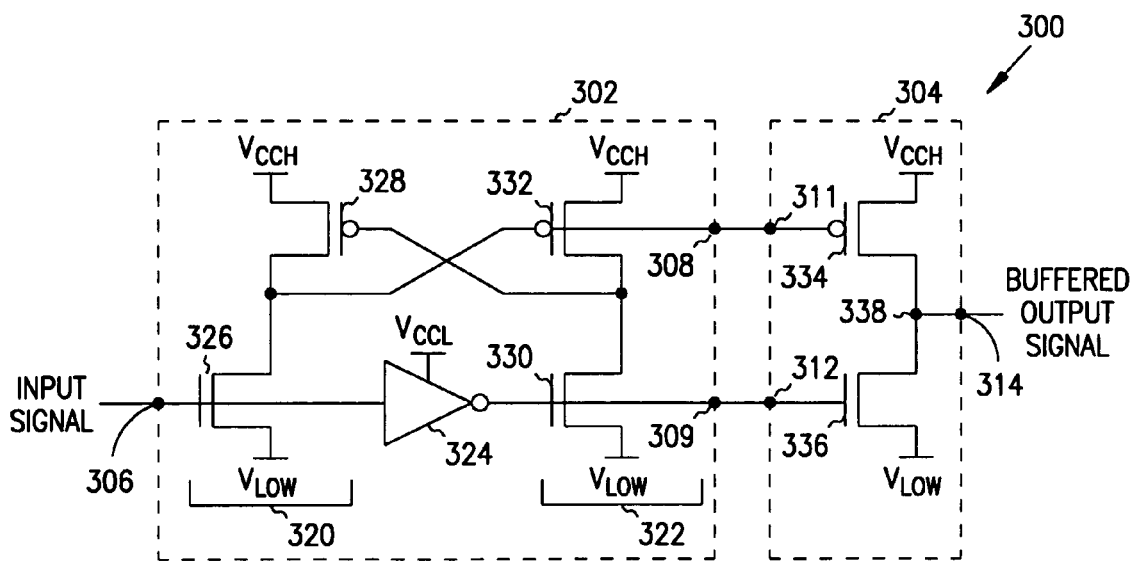
FIG. 3B is a schematic diagram of one embodiment of the voltage-level converter shown in FIG. 3A according to the teachings of the present invention.

FIG. 3B is a schematic diagram of one embodiment of the voltage-level converter 300 shown in FIG. 3A according to the teachings of the present invention. The voltage-level converter 300 includes the static voltage-level converter 302 and the split-level output circuit 304.

The static voltage-level converter 302 includes the input node 306, the first output node 308, the second output node 309, a first pair of transistors 320 connected in series, a second pair of transistors 322 connected in series, and an inverter 324. The first pair of transistors 320 includes a first transistor 326 and a second transistor 328. The first transistor 326 is coupled to the input node 306. The second pair of transistors 322 includes a first transistor 330 and a second transistor 332. The second transistor 332 of the second pair of transistors 322 is cross-coupled with the second transistor 328 of the first pair of transistors 320. Two transistors are cross-coupled by coupling a control port of a first transistor to a controlled port of a second transistor and by coupling a control port of a second transistor to a controlled port of the first transistor. As can be seen in FIG. 3B, the gate of transistor 328 (the control port of transistor 328) is coupled to the drain/source of transistor 332 (the controlled port of transistor 332) and the gate of transistor 332 (the control port of transistor 332) is coupled to the drain/source of transistor 328 (the controlled port of transistor 332). The inverter 324 is coupled to the input node 306, to the first transistor 326 of the first pair of transistors 320, to the first transistor 330 of the second pair of transistors 322, and to the second output node 309. The second transistor 332 of the second pair of transistors 322 is coupled to the first output node 308.

In one embodiment, transistors 328 and 332 are downsized to reduce contention. Reducing contention increases the performance of the voltage level converter 300.

The split-level output circuit 304 includes the first split-level input node 311, the second split-level input node 312, the split-level output node 314, a first insulated-gate field-effect transistor (FET) 334 coupled to the first split-level input node 311, and a second insulated-gate FET 336 coupled to the second split-level input node 312. The first insulated-gate FET 334 is connected in series with the second insulated-gate FET 336 and a common node 338 is formed at the drain/source connection between the drain/source of the first insulated-gate FET 334 and the drain/source of the second insulated-gate FET 336. The common node 338 is coupled to the split-level output node 314.

The static voltage-level converter 300, in one embodiment, is powered by a first voltage level, $V_{CCH}$, and a second voltage level, $V_{CCL}$, referenced to a third voltage level $V_{LOW}$, with the first voltage level being greater than the second voltage. The first pair of transistors 320 and the second pair of transistors 322 are connected to the first voltage level and the third voltage level, and the inverter 324 is connected to the second voltage level and the third voltage level (not shown). The split level output circuit 304 is connected between the first voltage level and the third voltage level. This power design permits the INPUT SIGNAL having signal levels of $V_{CCL}$ and $V_{LOW}$ to be converted to the BUFFERED OUTPUT SIGNAL having signal levels of $V_{CCH}$ and $V_{LOW}$.

In operation, the split-level output circuit 304 receives complementary inputs at the first split-level node 311 and the second split-level node 312 from the voltage-level converter 302. The first insulated-gate field-effect transistor (FET) 334 and the second insulated-gate FET 336 are each preferably operating in the saturation region. For the first insulated-gate FET 334 operating in the saturation region and the second insulated-gate FET 336 operating in the saturation region, the split-level output circuit 304 can source and sink equal amounts of current and can pull the output node 314 to a first voltage level or a second voltage. Thus, the split-level output circuit 304 can drive the same loads as a single level output circuit.

Figure 4A:
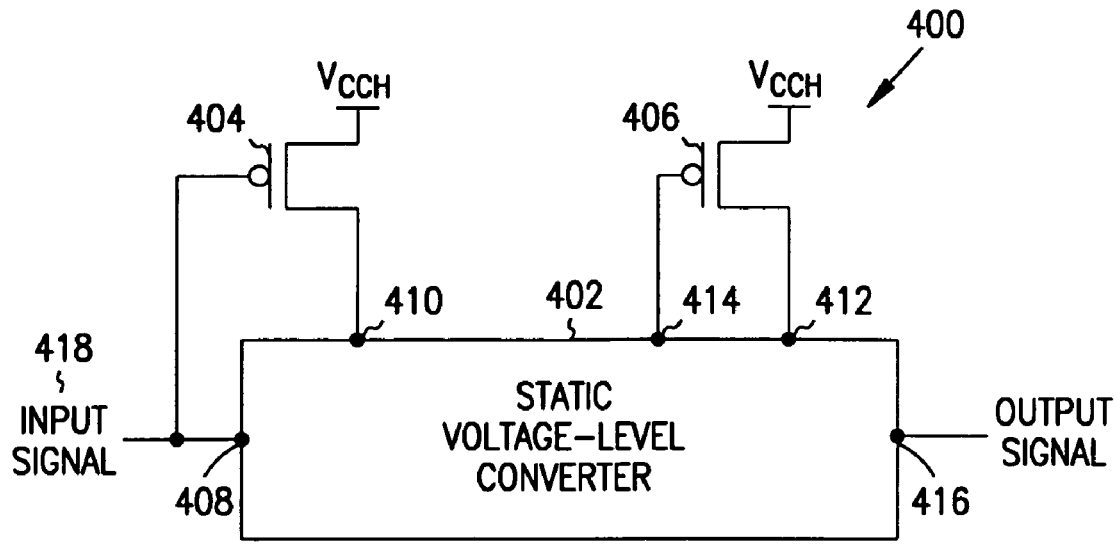
FIG. 4A is a block diagram of an alternative embodiment of a voltage-level converter according to the teachings of the present invention.

FIG. 4A is a block diagram of an alternative embodiment of a voltage-level converter 400 according to the teachings of the present invention. The voltage-level converter 400 includes a static voltage level converter 402, a first transistor 404, and a second transistor 406. The static voltage level converter 402 includes an input node 408, a first pull-up node 410, a second pull-up node 412, an inverter output node 414, and an output node 416. The first transistor 404 is coupled to the input node 408 and the first pull-up node 410. The second transistor 406 is coupled to the inverter output node 414 and to the second pull-up node 412.

The static voltage level converter 402 preferably comprises a circuit that consumes substantially zero power for static or unchanging inputs. Thus, for an input signal 418 having a logical zero voltage level or a logical one voltage level, the static voltage-level converter 402 consumes substantially zero power. The voltage-level converter 400 is not limited to use in connection with a particular static voltage-level converter 402. Any static voltage-level converter that consumes substantially zero power for static or unchanging inputs is suitable for use in connection with the voltage-level converter 400.

The first transistor 404 and the second transistor 406 are not limited to being fabricated in a particular technology. Any transistor capable of functioning as a switch in connection with the static voltage level converter 402 is suitable for use as the first transistor 404 and the second transistor 406. In one embodiment, the first transistor 404 and the second transistor 406 are insulated-gate field-effect transistors (FETs). In an alternative embodiment, the first transistor 404 and the second transistor 406 are p-type insulated-gate FETs.

The first transistor 404 and the second transistor 406 function as switches that substantially eliminate current flow between a high voltage source (shown as $V_{CCH}$ in FIG. 4A) and a low voltage source (shown in FIG. 4A, not shown in FIG. 4B) during transitions of the INPUT SIGNAL at the input node 408.

Figure 4B:
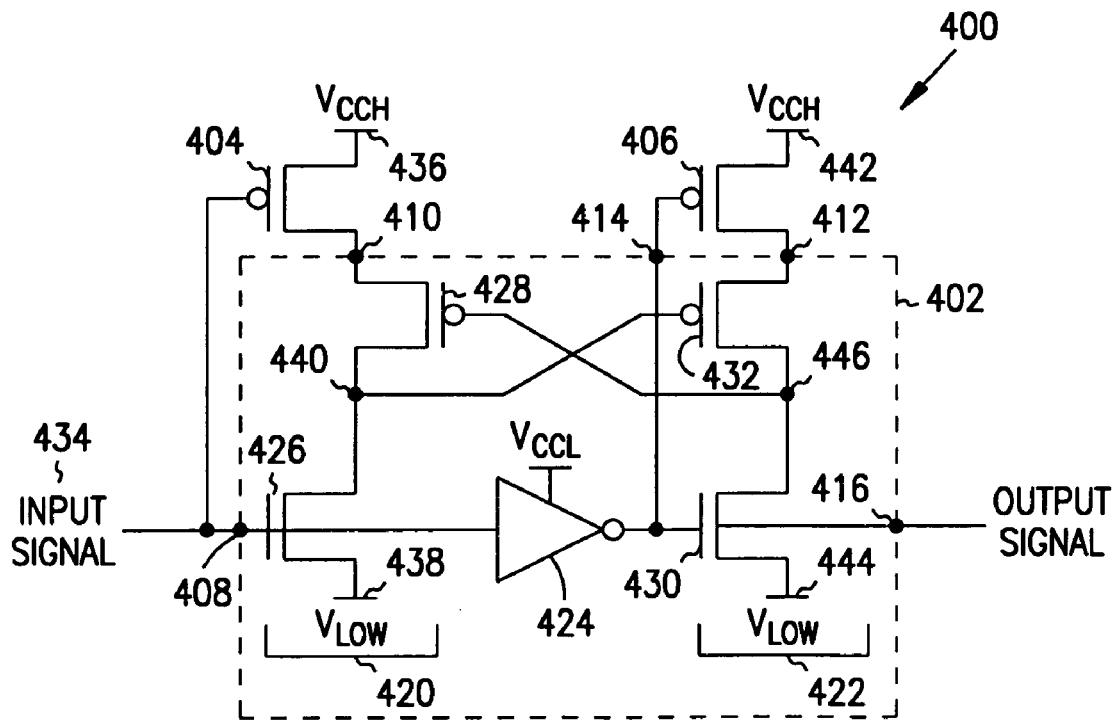
FIG. 4B is a schematic diagram of one embodiment of the voltage-level converter shown in FIG. 4A according to the teachings of the present invention.

FIG. 4B is a schematic diagram of one embodiment of the voltage-level converter 400 shown in FIG. 4A according to the teachings of the present invention. The voltage-level converter 400 includes the static voltage level converter 402, the first transistor 404, and the second transistor 406.

The static voltage level converter 402 includes the input node 408, the first pull-up node 410, the second pull-up node 412, the inverter output node 414, the output node 416, a first pair of transistors 420 connected in series, a second pair of transistors 422 connected in series, and an inverter 424. The first pair of transistors 420 includes a first transistor 426 and a second transistor 428. The first transistor 426 is coupled to the input node 408. The second pair of transistors 422 includes a first transistor 430 and a second transistor 432. The second transistor 432 of the second pair of transistors 422 is cross-coupled with the second transistor 428 of the first pair of transistors 420. Two transistors are cross-coupled by coupling a control port of a first transistor to a controlled port of a second transistor and by coupling a control port of a second transistor to a controlled port of the first transistor. As can be seen in FIG. 4B, the gate of the transistor 428 (the control port of the transistor 428) is coupled to the drain/source of transistor 432 (the controlled port of transistor 432) and the gate of the transistor 432 (the control port of transistor 432) is coupled to the drain/source of transistor 428 (the controlled port of transistor 428). The inverter 424 is coupled to the input node 408, to the first transistor 430 of the second pair of transistors 422, and to the output node 416.

The first transistor 404 is coupled to the input node 408 and the first pull-up node 410. The second transistor 406 is coupled to the inverter output node 414 and to the second pull-up node 412.

The first transistor 404 provides a switch in the current path between node 436 and node 438 that improves the performance of the static voltage-level converter 402 during a low-to-high transition of the INPUT SIGNAL at input node 408. During a low-to-high transition of the INPUT SIGNAL at the input node 408, the first transistor 404 and the transistor 426 switch at about the same time but before the transistor 428 switches. Switching the first transistor 404 and the transistor 426 at about the same time substantially eliminates current flow between the node 436 and the node 438, substantially eliminates voltage contention at the node 440, and substantially eliminates power consumption in the current path between the node 436 and the node 438.

The second transistor 406 provides a switch in the current path between the node 442 and the node 444 that improves the performance of the static voltage-level converter 402 during a high-to-low transition of the INPUT SIGNAL at input node 408. During a high-to-low transition of the INPUT SIGNAL at the input node 408, the second transistor 406 and the transistor 430 switch at about the same time but before the transistor 432 switches. Switching the second transistor 406 and the transistor 432 at about the same time substantially eliminates current flow between node 442 and node 444, substantially eliminates voltage contention at node 446, and substantially eliminates power consumption in the current path between node 442 and node 444.

Figure 4C:
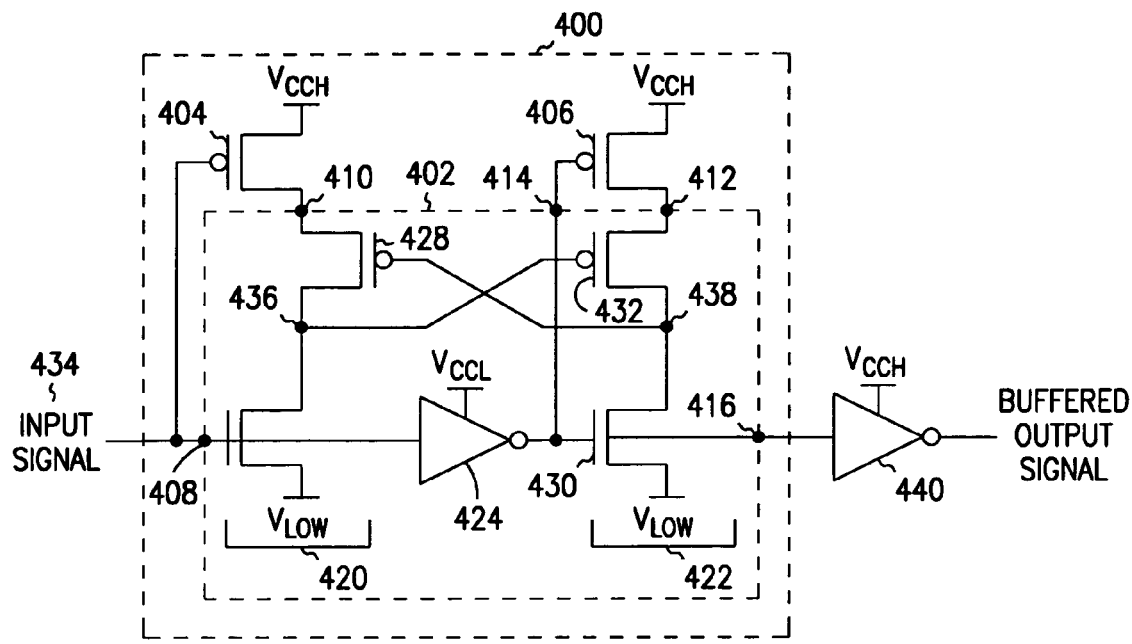
FIG. 4C is a schematic diagram of one embodiment of the voltage-level converter shown in FIG. 4B coupled to an inverter according to the teachings of the present invention.

FIG. 4C is a schematic diagram of the voltage-level converter 400 shown in FIG. 4A coupled to an inverter 440 according to the teachings of the present invention. Coupling the voltage-level converter 400 to the inverter 440 improves the drive capability of the voltage-level converter 400. In one embodiment, the inverter 440 is a single-input inverter.

Figure 4D:
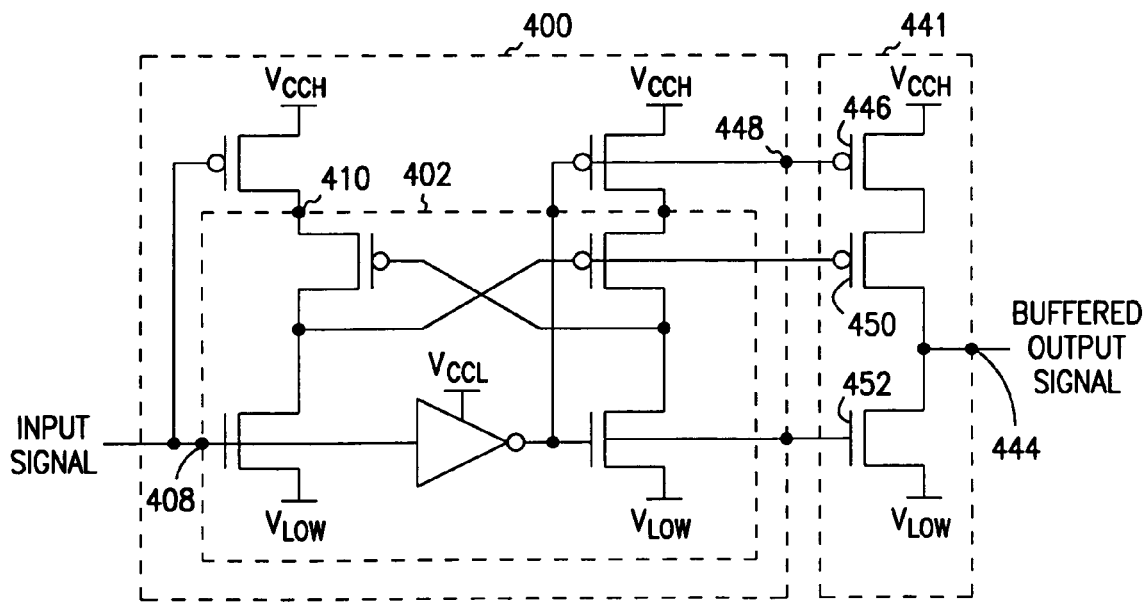
FIG. 4D is a schematic diagram of one embodiment of the voltage level converter of FIG. 4B coupled to a split-level output buffer according to the teachings of the present invention.

FIG. 4D is a schematic diagram of the voltage level converter 400 shown in FIG. 4A coupled to a split-level output buffer 441 according to the teachings of the present invention. The split-level output buffer 441 is a multiple-input inverter. The split-level buffer 441 includes an n-type insulated-gate field-effect transistor (FET) 452 coupled to an output node 444, a first p-type insulated-gate FET 446 coupled to the inverter output node 448, and a second p-type insulated-gate FET 450 coupled to the static level converter 402. The n-type insulated gate FET 452, the first p-type insulated-gate FET 446, and the second p-type insulated-gate FET 450 are connected in series.

All circuits in the voltage-level converter 400, for the embodiments shown in FIGS. 4B-4D, are powered by the voltage level $V_{CCH}$ and the voltage level $V_{LOW}$ except for the inverter 424, which is powered by the voltage level $V_{CCL}$, which has a voltage value less than $V_{CCH}$. This power design permits the INPUT SIGNAL having signal levels of $V_{CCL}$ and $V_{LOW}$ to be converted to the BUFFERED OUTPUT SIGNAL having signal levels of $V_{CCH}$ and $V_{LOW}$.

Figure 5A:
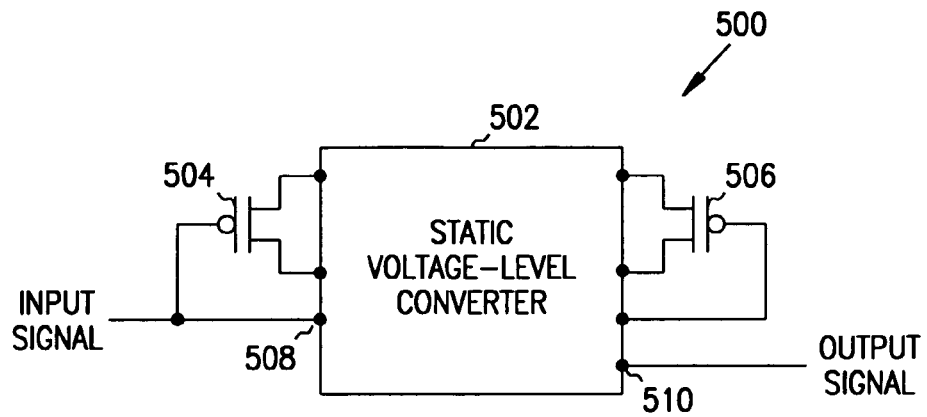
FIG. 5A is a block diagram of another alternative embodiment of a voltage-level converter according to the teachings of the present invention.

FIG. 5A is a block diagram of an alternative embodiment of a voltage-level converter 500 according to the teachings of the present invention. The voltage-level converter 500 includes a static voltage-level converter 502, a first transistor 504, and a second transistor 506. The static voltage-level converter 502 includes an input node 508 and an output node 510. The first transistor 504 is coupled to the input node 508 and the static voltage-level converter 502. The second transistor 506 is coupled to the static voltage-level converter 502.

The first transistor 504 and the second transistor 507 are preferably insulated-gate field-effect transistors (FETs), however the first transistor 504 and the second transistor 507 are not limited to insulated-gate FETs. The first transistor 504 and the second transistor 507 can be fabricated using any fabrication technology that is capable of producing transistors compatible with the static voltage-level converter 502.

Figure 5B:
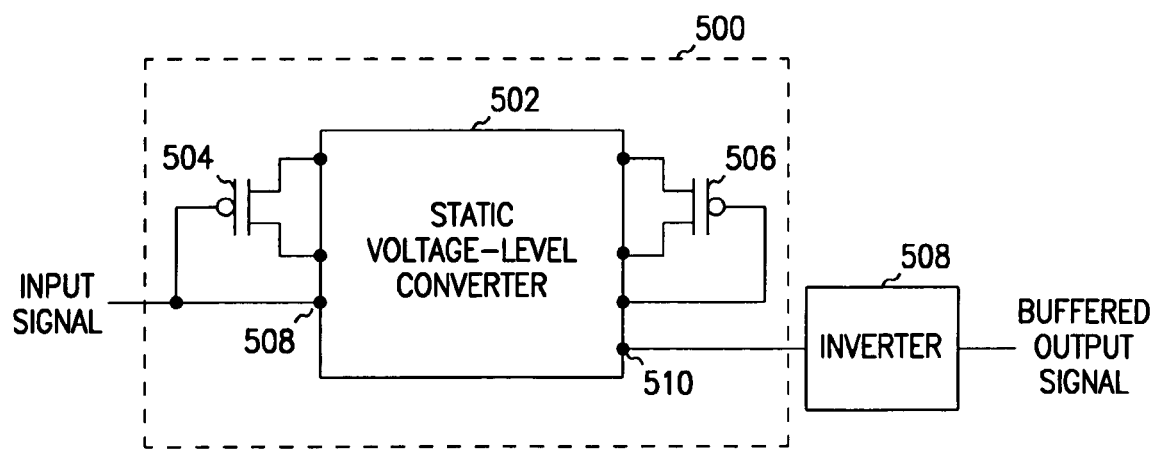
FIG. 5B is a block diagram of one embodiment of the voltage-level converter shown in FIG. 5A coupled to an inverter according to the teachings of the present invention.
Figure 5C:
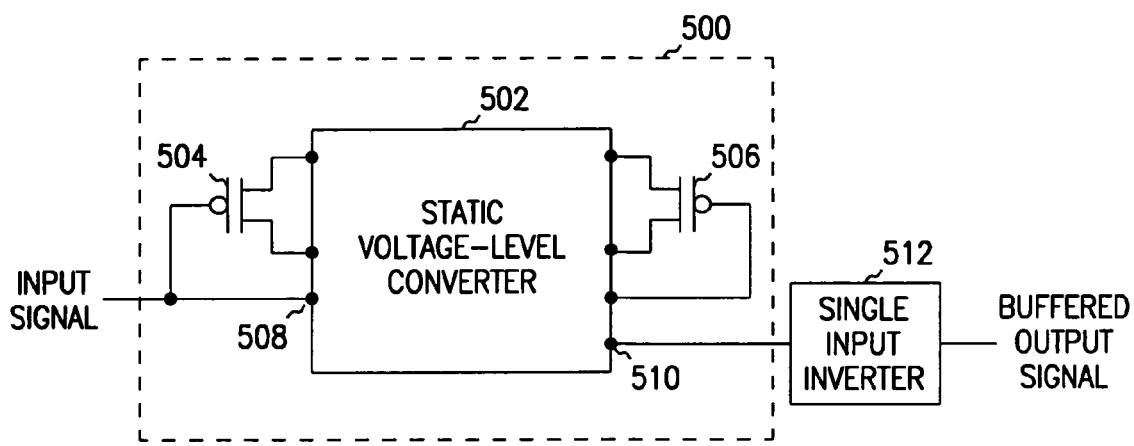
FIG. 5C is a block diagram of one embodiment of the voltage-level converter shown in FIG. 5A coupled to a single-input inverter according to the teachings of the present invention.
Figure 5D:
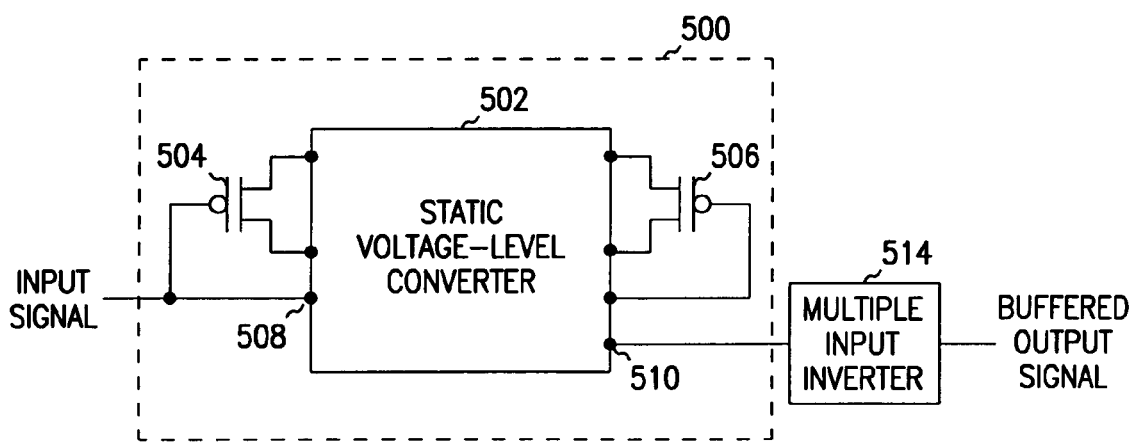
FIG. 5D is a block diagram of one embodiment of the voltage-level converter shown in FIG. 5A coupled to a split-level inverter according to the teachings of the present invention.

FIG. 5B is a block diagram of one embodiment of the voltage-level converter 500 shown in FIG. 5A coupled to an inverter 508. The voltage-level converter is not limited to being coupled to a particular type of inverter. In one embodiment, as shown in FIG. 5C, the voltage-level converter 500 is coupled to a single-input converter 512. In an alternative embodiment, as shown in FIG. 5D, the voltage-level converter 500 is coupled to a multiple-input inverter 514.

Figure 6A:
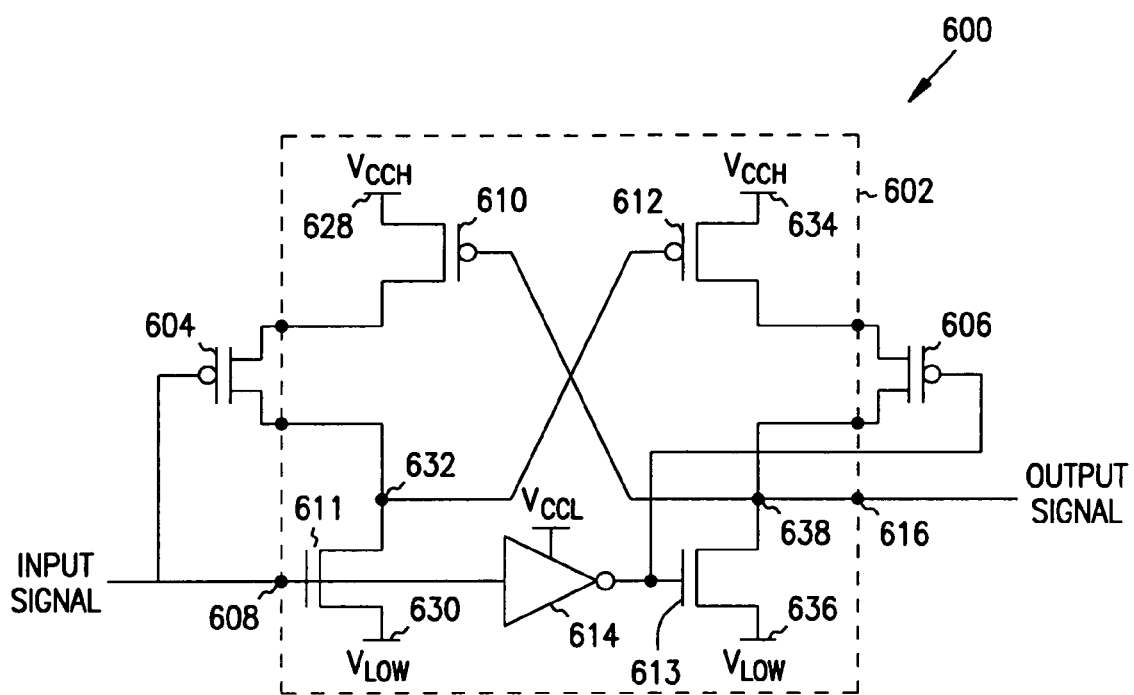
FIG. 6A is a schematic diagram of still another embodiment of a voltage-level converter according to the teachings of the present invention.

FIG. 6A is a schematic diagram of one embodiment of a voltage-level converter 600 according to the teachings of the present invention. The voltage-level converter 600 includes a static voltage-level converter 602, a first transistor 604, and a second transistor 606. The static voltage-level converter 602 includes an input node 608, a first pair of serially connected transistors 610 and 611, a second pair of serially connected transistors 612 and 613, and an inverter 614. The input node 608 is connected to the transistor 611. The inverter 614 couples the transistor 611 to the transistor 613. The first transistor 604 is located between the transistor 610 and the transistor 611 and is coupled to the input node 608. The second transistor 606 is located between the transistor 612 and the transistor 613 and is and coupled to the inverter 614. The output node 616 is coupled to the transistor 613.

The static voltage-level converter 602 is not limited to being fabricated using a particular technology. In one embodiment, the transistors 610-611, 612-613, and the inverter 614 are insulated-gate field effect transistors fabricated using a complementary metal-oxide semiconductor process.

The first transistor 604 and the second transistor 606 are also not limited to being fabricated using a particular technology. The first transistor 604 and the second transistor 606 can be fabricated using any fabrication technology, such as a complementary metal-oxide semiconductor (CMOS) process, that produces transistors that are compatible with the fabrication technology used to fabricate the static voltage-level converter 602. In one embodiment, the first transistor 604 and the second transistor 606 are insulated-gate field-effect transistors fabricated using a CMOS process. In an alternative embodiment, the first transistor 604 and the second transistor 606 are p-type insulated-gate field-effect transistors fabricated using a CMOS process.

Figure 6B:
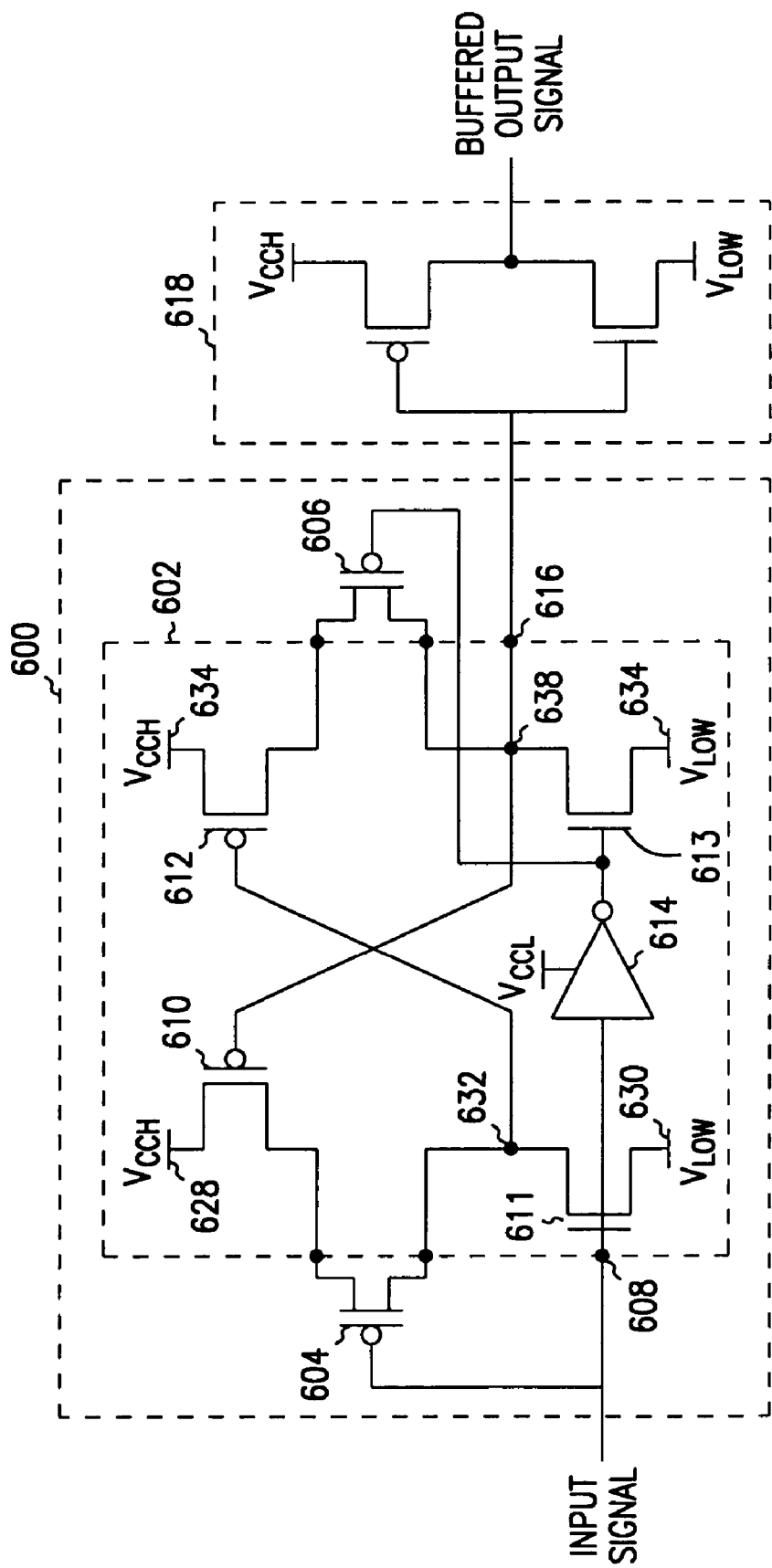
FIG. 6B is a schematic diagram of one embodiment of the voltage-level converter shown in FIG. 6A coupled to a single-input inverter according to the teachings of the present invention.

FIG. 6B is a schematic diagram of the voltage-level converter 600 shown in FIG. 6A coupled to a single-input buffer 618 according to the teachings of the present invention. The single-input buffer 618 is not limited to being fabricated using a particular technology. In one embodiment, the single-input buffer 618 comprises a pair of serially connected insulated-gate field-effect transistors fabricated using a complementary metal-oxide semiconductor (CMOS) process.

Figure 6C:
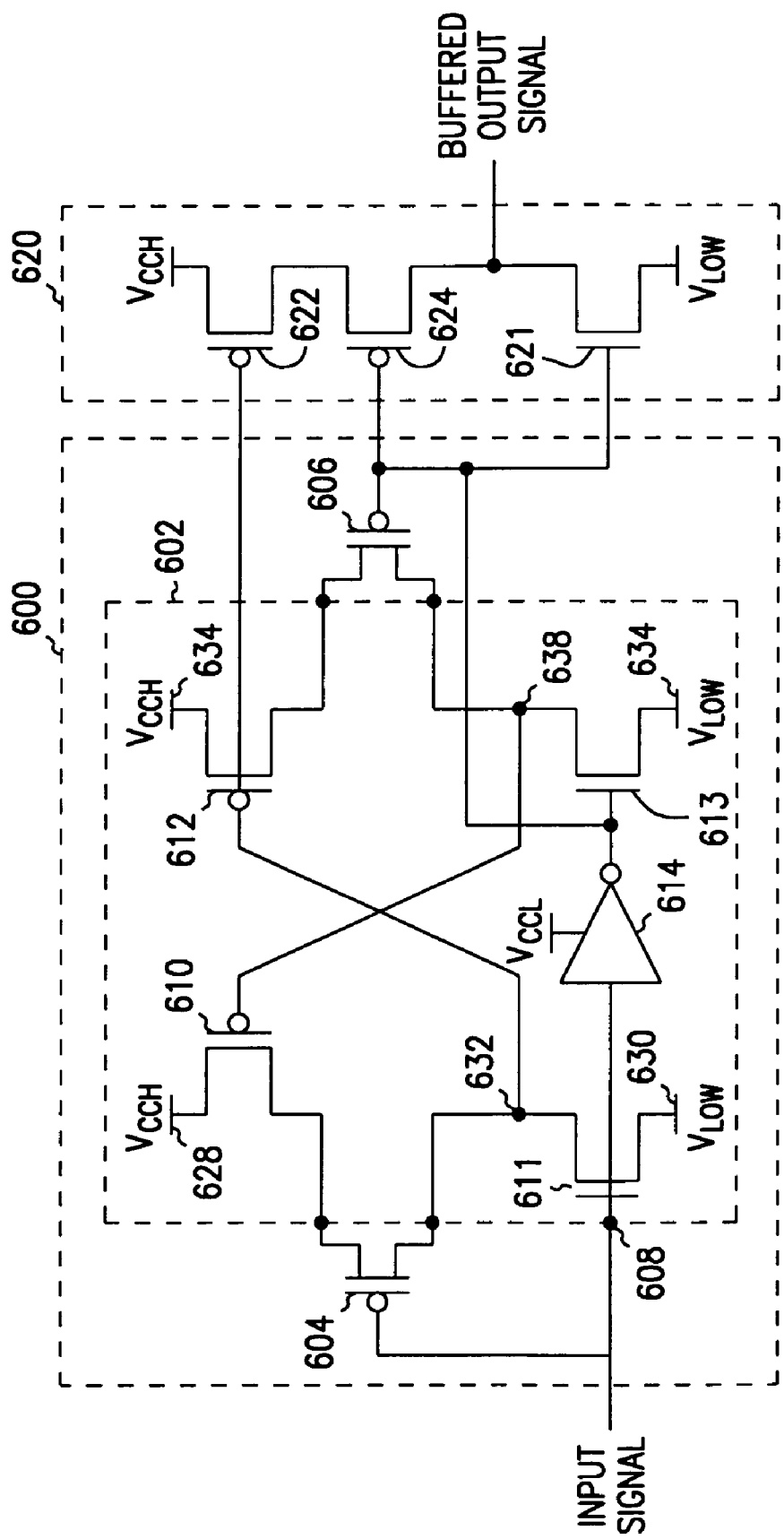
FIG. 6C is a schematic diagram of the voltage-level converter shown in FIG. 6A coupled to a multiple-input buffer according to the teachings of the present invention.

FIG. 6C is a schematic diagram of the voltage-level converter 600 shown in FIG. 6A coupled to a multiple-input buffer 620 according to the teachings of the present invention. In one embodiment, the multiple-input buffer 620 is a multiple-input inverter coupled to at least three outputs of the static voltage-level converter 602. The multiple-input buffer 620 includes an n-type insulated-gate field-effect transistor (FET) 621, a first p-type insulated-gate FET 622, and a second p-type insulated-gate FET 624. The n-type insulated-gate FET 621, the first p-type insulated-gate FET 622, and the second p-type insulated-gate FET 624 are connected in series, and the n-type insulated-gate FET 621 is coupled to the inverter 614, the first p-type insulated-gate FET 622 is coupled to the node 632, and the second p-type insulated-gate FET is coupled to the inverter 614.

In each of the voltage-level converters 600 shown in FIGS. 6A-6C, the first transistor 604 provides a switch in the current path between node 628 and node 630 that improves the performance of the static voltage-level converter 600 during a low-to-high transition of the INPUT SIGNAL at the input node 608. During a low-to-high transition of the INPUT SIGNAL at the input node 608, the first transistor 604 and the transistor 611 switch at about the same time but before the transistor 610 switches. Switching the first transistor 604 and the transistor 611 at about the same time substantially eliminates current flow between the node 628 and the node 630, substantially eliminates voltage contention at the node 632, and substantially eliminates power consumption in the current path between the node 628 and the node 630.

In each of the voltage-level converters 600 shown in FIGS. 6A-6C, the second transistor 606 provides a switch in the current path between node 634 and node 636 that improves the performance of the static voltage-level converter 600 during a high-to-low transition of the INPUT SIGNAL at input node 608. During a high-to-low transition of the INPUT SIGNAL at the input node 608, the second transistor 606 and the transistor 613 switch at about the same time but before the transistor 612 switches. Switching the second transistor 606 and the transistor 612 at about the same time substantially eliminates current flow between the node 634 and the node 636, substantially eliminates voltage contention at the node 638, and substantially eliminates power consumption in the current path between the node 634 and the node 636.

Each of the voltage-level converters shown in FIGS. 3A-3B, FIGS. 4A-4D, FIGS. 5A-5D, and FIGS. 6A-6C consume less power than the current best methods for voltage-level conversion, can be used as a drop-in replacement for commonly used voltage-level converters, and avoids signal contention on internal nodes.

Figure 7A:
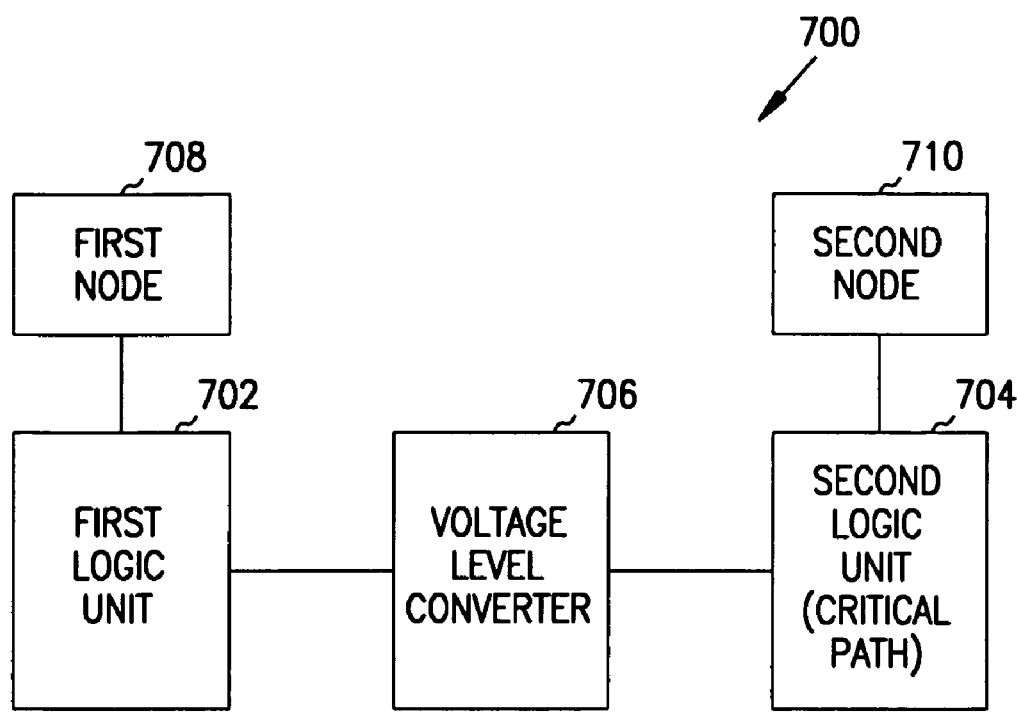
FIG. 7A is a block diagram of some embodiments of a logic unit including a voltage-level converter coupling one or more first logic units to one or more second logic units according to the teachings of the present invention.

FIG. 7A is a block diagram of some embodiments of a logic unit 700 including one or more first logic units 702, one or more second logic units 704, and a voltage-level converter 706. The voltage-level converter 706 is coupled to at least one of the one or more first logic units 702 and at least one of the one or more second logic units 704 and couples signals generated by the one or more first logic units 702 to the one or more second logic units 704.

The one or more first logic units 702, in one embodiment, include logic units in a non-critical path or functional unit (see the Background for a definition of "non-critical path" and "non-critical functional unit") coupled to a first node 708 powered at a first voltage level. Exemplary logic units in a non-critical path or functional unit include memory and storage circuits. The one or more second logic units 704 include logic circuits in a critical path or functional unit (see the Background for a definition of "critical path" and "critical functional unit") coupled to a second node 710 powered at a second voltage level that is greater than the first voltage level. Exemplary critical path logic units include clock generation and distribution circuits. Exemplary critical functional units include arithmetic and logic circuits. In operation, the voltage-level converter 706 converts logic signals produced by the one or more first logic units 702, such as storage or memory circuits, to logic signals compatible with the one or more second logic units 704, such as clock distribution circuits.

The one or more first logic units 702 and the one or more second logic units 704 are preferably fabricated using a complementary metal-oxide semiconductor (CMOS) process. However, the one or more first logic units 702 and the one or more second logic units 704 are not limited to being fabricated using a CMOS process. Any process or technology used in the fabrication of logic circuits is suitable for use in connection with the present invention.

The logic unit 700 is not limited to use in connection with a particular voltage-level converter 706. Some embodiments of the voltage-level converter 706 suitable for use in connection with the logic unit 700 include the voltage level converters shown in FIGS. 3A-3B, FIGS. 4A-4D, FIGS. 5A-5D, and FIGS. 6A-6C.

Figure 7B:
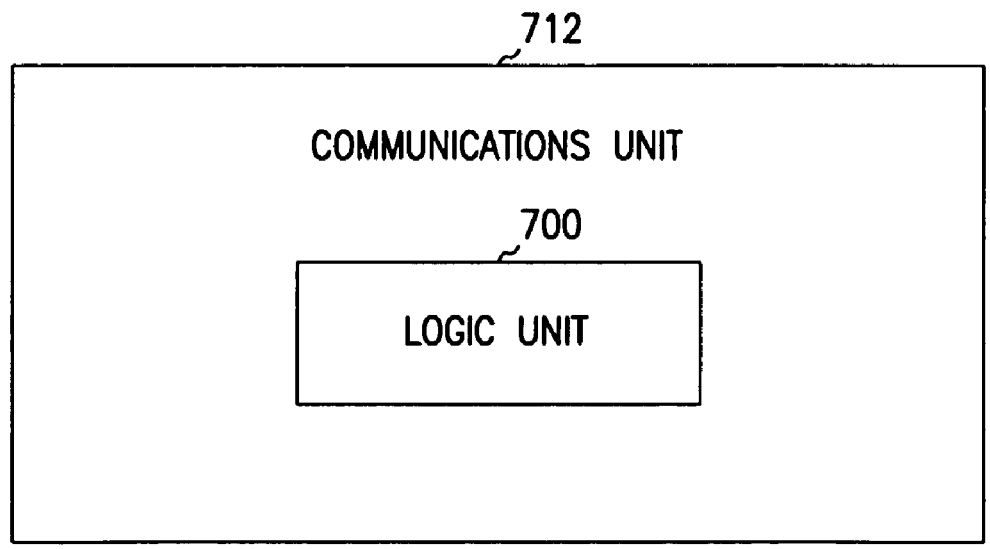
FIG. 7B is a block diagram of one embodiment of the logic unit shown in FIG. 7A embedded in a communication unit according to the teachings of the present invention.

FIG. 7B is a block diagram of one embodiment of the logic unit 700 shown in FIG. 7A embedded in a communication unit 712 according to the teachings of the present invention. Exemplary communication units suitable for use in connection with the logic unit 700 include cell phones and cell phone base stations. However, the logic unit 700 is not limited to being embedded in a communication unit, and that the logic unit 700 can be embedded in any logic system that requires voltage level conversion. Exemplary logic systems in which the logic unit 700 can be embedded include microprocessors, digital signal processors, personal digital assistants, and application specific integrated circuits.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. A voltage-level converter comprising:
a static voltage-level converter having an input node and at least three outputs, the static voltage-level converter including no more than four transistors and a first inverter, the no more than four transistors including a first pair of transistor including a first transistor and a second transistor connect in series between a first voltage level and a first pull-up node and a second pair of transistors including a third transistor and a four transistor connected in series between the first voltage level and a second pull-up node;
a fifth transistor coupled to the input node and the first pull up node of the static voltage-level converter, the fifth transistor coupling the first pull-up node to a second voltage level;

a sixth transistor coupled to the input node though a first inverter, the sixth transistor coupling the second pull-up node of the static voltage-level converter to the second voltage level; and a second inverter having no more than three transistors coupled in series, the no more than three transistors coupled in series coupling the first voltage level to the second voltage level, wherein a gate of each of the no more than three transistors of the second inverter is coupled to one and only one of the at least three outputs of the static voltage-level converter.

2. The voltage-level converter of claim 1, wherein the fifth transistor comprises a p-type insulated-gate field-effect transistor.

3. The voltage-level converter of claim 2, wherein the sixth transistor comprises a p-type insulated-gate field-effect transistor.

4. The voltage-level converter of claim 1, wherein the second inverter includes a first input coupling the output of the first inverter and a gate of the third transistor to a gate of a first of the no more than three transistors of the second inverter, the first of the no more than three transistors having a drain/source directly connected to the first voltage level.

5. The voltage-level converter of claim 1, wherein the second inverter includes a second input coupling a gate of the fourth transistor and a node between a drain/source of the first transistor and a drain/source of the second transistor to a gate of a second of the no more than three transistor of the second inverter, the second of the no more than three transistors having a drain/source coupled to a buffered output of the second inverter.

6. The voltage-level converter of claim 1, wherein the second inverter includes a third input coupling the output of the first inverter and a gate of the sixth transistor to a gate of a third of the no more than three transistors of the second inverter, the third of the no more than three transistors having a drain/source directly connected to the second voltage level.

7. A voltage-level converter comprising:

a static voltage-level converter including no more than six transistors and a single input inverter, the static voltage-level converter comprising an input node, at least three outputs, a first pair of serially connected transistors, a second pair of serially connected transistors;

a first transistor located between the first pair of serially connected transistors and coupled to the input node;

a second transistor located between the second pair of serially connected transistors and coupled to the inverter; and a multiple input inverter coupled to each of the at least three outputs of the static-level converter, the multiple input inverter including no more than three transistors, the no more than three transistor including an n-type insulated-gate field-effect transistor coupled to a multiple input inverter output node, a first p-type insulated-gate field-effect transistor coupled to the multiple input inverter output node, a second p-type insulated-gate field-effect transistor coupled to the static level converter, wherein the n-type insulated-gate field-effect transistor, the first p-type insulated-gate field-effect transistor, and the second p-type insulated-gate field-effect transistor are connected in series.

8. The voltage-level converter of claim 7, wherein the first transistor comprises an insulated-gate field-effect transistor.

9. The voltage-level converter of claim 8, wherein the second transistor comprises an insulated-gate field-effect transistor.

10. A logic unit comprising:

one or more first logic units adapted to operate at a first voltage;

one or more second logic units adapted to operate at a second voltage, the second voltage being greater than the first voltage; and a voltage-level converter for coupling at least one of the one or more first logic units to at least one of the one or more second logic units, the voltage-level converter comprising:

a static-level converter including no more than six transistors and a single input inverter, the static-level converter comprising an input node coupled to at least one of the one or more first logic units, at least three outputs coupled to at least one of the one or more second logic units through a multiple input inverter, the static-level converter including a first pair of serially connected transistors, and a second pair of serially connected transistors;

a first transistor located between the first pair of serially connected transistors and coupled to the input node;

a second transistor located between the second pair of serially connected transistors and coupled to an output of the single input inverter; and the multiple input inverter coupled to each of the at least three outputs of the static-level converter, the multiple input inverter including no more than three transistors, the no more than three transistor including an n-type insulated-gate field-effect transistor coupled to a multiple input inverter output node, a first p-type insulated-gate field-effect transistor coupled to the multiple input inverter output node, a second p-type insulated-gate field-effect transistor coupled to the static level converter, wherein the n-type insulated-gate field-effect transistor, the first p-type insulated-gate field-effect transistor, and the second p-type insulated-gate field-effect transistor are connected in series.

11. The voltage-level converter of claim 10, wherein the first transistor comprises a first insulated-gate field-effect transistor and the second transistor comprises a second insulated-gate field-effect transistor.

12. The voltage-level converter of claim 11, wherein the first insulated-gate field-effect transistor comprises a p-type insulated-gate field-effect transistor and the second insulated-gate field-effect transistor comprises a p-type insulated-gate field-effect transistor.

13. A voltage-level converter comprising:

a static voltage-level converter including an input node, a first pull-up node, a second pull-up node, an inverter output node, and an output node;

a first transistor coupled to the input node and the first pull-up node;

a second transistor coupled to the second pull-up node and the inverter output node, wherein the first transistor and the second transistor couple the static-level converter to a first voltage level that is greater than both a second voltage level and a third voltage level that may be provided at the input node; and an inverter coupled to the output node, wherein the inverter includes an n-type insulated-gate field-effect transistor coupled to the output node, a first p-type insulated-gate field-effect transistor coupled to the inverter output node, a second p-type insulated-gate field-effect transistor coupled to the static level converter, wherein the n-type insulated-gate field-effect transistor, the first n-type insulated-gate field-effect transistor, and the second p-type insulated-gate field-effect transistor are connected in series.

14. The voltage-level converter of claim 7, wherein the single-input inverter includes an input coupled to the input node and an output coupled to at least one gate of the no more than three transistor of the multiple input inverter.

15. The voltage level converter of claim 14, wherein the output of the single-input inverter is couple to a gate of the n-type insulated-gate field-effect transistor and a gate of the first p-type insulated-gate field-effect transistor.

16. The voltage level converter of claim 7, wherein the second transistor includes a gate directly coupled to at least one gate of the no more than three transistors of the multiple input inverter.

17. The voltage level converter of claim 7, wherein the second p-type insulated-gate field-effect transistor includes a drain/source directly connected to the second voltage level that is greater than both the first voltage level and a third voltage level that may be provided at the input node.

18. The voltage-level converter of claim 13, wherein the first transistor comprises an insulated gate field-effect transistor and the second transistor comprises an insulated-gate field-effect transistor.

19. The voltage-level converter of claim 13, wherein the first transistor comprises a p-type insulated-gate field-effect transistor and the second transistor comprises a p-type insulated-gate field-effect transistor.

* * * * *

UNITED STATES PATENT AND TRADEMARK OFFICE
CERTIFICATE OF CORRECTION

| | | |
|---|---|---|
| PATENT NO. | : 7,352,209 B2 | Page 1 of 1 |
| APPLICATION NO. | : 11/411647 | |
| DATED | : April 1, 2008 | |
| INVENTOR(S) | : Hsu et al. | |

It is certified that error appears in the above-identified patent and that said Letters Patent is hereby corrected as shown below:

In column 13, line 2, in Claim 13, delete "n-type" and insert -- p-type --, therefor.

Signed and Sealed this

Nineteenth Day of August, 2008

JON W. DUDAS
*Director of the United States Patent and Trademark Office*